(12) United States Patent
Kurtz et al.

(10) Patent No.: US 6,210,987 B1
(45) Date of Patent: Apr. 3, 2001

(54) VERTICAL CAVITY-EMITTING POROUS SILICON CARBIDE LIGHT-EMITTING DIODE DEVICE AND PREPARATION THEREOF

(75) Inventors: Anthony D. Kurtz, Teaneck; Jonathan E. Spanier, Cliffside Park, both of NJ (US)

(73) Assignee: Kulite Semiconductor Products Inc., Leonia, NJ (US)

( * ) Notice: Subject to any disclaimer, the term of this patent is extended or adjusted under 35 U.S.C. 154(b) by 0 days.

(21) Appl. No.: 09/286,397

(22) Filed: Apr. 5, 1999

Related U.S. Application Data

(62) Division of application No. 08/862,102, filed on May 22, 1997, now Pat. No. 5,939,732.

(51) Int. Cl.[7] ............................................. H01L 21/00
(52) U.S. Cl. .............................. 438/47; 438/42; 438/44
(58) Field of Search ............................. 438/42, 44, 45, 438/46, 47

(56) References Cited

U.S. PATENT DOCUMENTS

| | | | |
|---|---|---|---|
| 5,162,878 | * 11/1992 | Sasagawa et al. | 257/88 |
| 5,331,180 | * 7/1994 | Yamada et al. | 257/3 |
| 5,376,241 | 12/1994 | Shor et al. | 204/129.3 |
| 5,454,915 | 10/1995 | Shor et al. | 204/129.3 |
| 5,569,932 | * 10/1996 | Shor et al. | 257/3 |
| 5,596,595 | * 1/1997 | Tan et al. | 372/96 |
| 5,757,024 | * 5/1998 | Fathauer et al. | 257/19 |
| 5,834,378 | * 11/1998 | Kurtz et al. | 438/22 |

* cited by examiner

Primary Examiner—Kevin M. Picardat
(74) Attorney, Agent, or Firm—Arthur L. Plevy; Buchanan Ingersoll PC

(57) ABSTRACT

A multilayered LED structure which has an active light-emitting layer of porous silicon carbide and a sequence of layers of porous silicon carbide underneath which serves as a quarter-wavelength multilayer mirror. The result is the electroluminescent emission of spectrally narrow visible light in the deep blue to UV range, in a highly directed pattern. The deep, intense blue luminescence is accomplished via the appropriate preparation and passivation of a single porous silicon carbide layer, followed by the deposition of a transparent, semiconducting layer, such as ITO ($In_2O_3$) or ZnO.

12 Claims, 1 Drawing Sheet

VERTICAL CAVITY-EMITTING POROUS SILICON CARBIDE LIGHT-EMITTING DIODE DEVICE AND PREPARATION THEREOF

RELATED APPLICATIONS

This is a divisional of U.S. patent application Ser. No. 08/862,102, filed May 22, 1997 and issued as U.S. Pat. No. 5,939,732 on Aug. 17, 1999. Kulite Semiconductor Products, Inc., the assignee herein, is record owner of U.S. patent application Ser. No. 08/724,410, filed Oct. 1, 1996 by Kurtz et al., issued as U.S. Pat. No. 5,834,378 on Nov. 10, 1998, and entitled Passivation of Porous Semiconductors for Improved Optoelectronic Device Performance and Light-Emitting Diode Based on Same.

FIELD OF THE INVENTION

This invention relates to semiconductor devices in general and more particularly, to a multilayered light emitting diode structure which employs porous silicon carbide.

BACKGROUND OF THE INVENTION

Quantum mechanics dictates that electrons making transitions between allowed energy levels gain or lose a specific quanta of energy. In particular, the transition of an electron to an excited state is associated with the absorption of a quanta of energy and the transition of an electron to a state of lower energy produces a quanta of energy. In the latter case in which electrons make downward transitions to a lower energy level, energy is released in the form of both crystal lattice vibrations, i.e., phonons, and emitted light photons. The lattice vibrations are manifested as heat, while the photons are observable as light energy, which, if in the visible spectrum and of sufficient intensity, can be detected by the human eye.

Light emitting diodes (LEDs) are well known semiconductor devices which convert electrical energy into emitted light. In a LED, the generation or injection of a current across the LED's diode junction followed by the recombination of the injected carriers encourages such electronic transitions and their resulting productions of vibrational energy or light, or both.

In these electronic transitions, it is well known that the wavelength of the light produced is controlled by the energy difference of the electronic transition. Accordingly, smaller electronic transitions within the visible spectrum, tend to emit longer wavelengths of light toward the red portion of the visible spectrum, and larger energy transitions tend to emit shorter wavelengths of light toward the violet portion of the visible spectrum. Such transitions are used to characterize the materials in which they occur, thereby enabling materials to be identified by the specific manner in which they behave under incident electromagnetic radiation, including visible, ultraviolet and infrared light. Hence, the peak wavelengths and associated colors of the luminescence generated by a given type of semiconductor material are restricted to a select few. For various physical and technological reasons, it has been more difficult to produce LEDs which emit shorter wavelengths of light toward the violet portion of the spectrum, including blue LEDs.

Since blue is one of the primary colors, the limited availability of inexpensive efficient blue LEDs creates limitations in related technological fields.

It is known that, theoretically, blue light can be produced by any semiconductor material having a band gap of at least ~2.5 electron volts (eV). The band gap of a given semiconductor material is the energy difference between the conduction band and the valence band of the semiconductor materials. Consequently, blue light emitting semiconductor diodes must be formed from a relatively large band gap semiconductor material such as gallium nitride (GaN), zinc selenide (ZnSe) or alpha silicon carbide ($\alpha$-SiC).

The blue light produced by some of these semiconductor materials can be made more intense and more efficiently, by making the semiconductor material porous using well known anodizing and photoanodizing techniques. Some porous semiconductor materials exhibit unique optical properties which their bulk semiconductor counterparts can not equal. An example of this superiority is found in porous SiC which has exceptional optical and unique electronic properties due to its geometry. More specifically, porous SiC exhibits visible transparency and intense blue photoluminescence and electroluminescence. In terms of developing optoelectronic devices from porous semiconductor materials, some progress has been made in developing porous Si-based light emitting devices. Since the oxidation rates of bulk SiC and porous SiC are much lower than that of bulk Si and porous Si, and since SiC has been identified as a material for use at high temperatures, optoelectronic devices based on porous SiC will be much more stable over longer periods of time, and also at higher temperatures than those based on porous Si.

Another unique optical property of porous semiconductor materials, one which is employed in the current innovation, is that the porous semiconductor layer can be prepared so that its optical index of refraction varies spatially, in a periodic or continuously varying manner, or otherwise, due to a change in its porosity. With this, such a structure can function as an optical waveguide or optical interference filter.

Films of SiC are made porous by electrochemically fabricating a microcrystalline porous structure from bulk SiC with pore spacings of "quantum" dimensions (less than 10 nm). The resulting porous structure provides a large internal surface. The porous structure can be fabricated using either dark-current or light-assisted electrochemical means as disclosed in U.S. Pat. No. 5,376,241 entitled FABRICATING POROUS SILICON CARBIDE and U.S. Pat. No. 5,454,915 entitled METHOD OF FABRICATING POROUS SILICON CARBIDE (SIC), both of which were issued to Joseph S. Shor and Anthony D. Kurtz on Oct. 3, 1995 and assigned to Kulite Semiconductor Products, Inc., the assignee herein. Using these techniques to make films of SiC porous, it is possible to increase the quantum efficiency of SiC, resulting in UV or deep blue luminescence. Such porous SiC films exhibit a spectrally integrated photoluminescence intensity (and efficiency) which is approximately twenty (20) times higher than that which is observed from bulk Si, as discussed in Jonathan E. Spanier, et al., "Effects of Nanocrystalline Structure and Passivation on the Photoluminescent Properties of Porous Silicon Carbide", Mat. Res. Soc. Symp. Proc. Vol 452, pp 491–496, (1997). Accordingly, devices fabricated from porous SiC using existing processing techniques such as those described in U.S. Pat. Nos. 5,376,241 and 5,454,915, enable the development of semiconductor UV and blue light source and UV/blue optoelectronic devices.

The luminescence in the blue range of the spectrum can be further enhanced by passivating porous SiC with a passivation agent such as oxygen or hydrogen. Passivation enables the microcrystalline structures to satisfy the conditions for quantum confinement by preventing surface recombination at the dangling bond. Passivating agents that may be employed for this purpose include atomic hydrogen, deposited by a plasma or by an HF dip, oxygen, formed by thermal oxidation, anodically, or PECVD (plasma enhanced chemical vapor deposition) of oxygen, or any other passivating agent which will complete the dangling bond sites.

Initial demonstrations of room temperature luminescence from porous semiconductor materials such as porous SiC, created mush speculation about the mechanisms which provide visible luminescence. However, it is now generally agreed, based on considerable theoretical and experimental evidence, that, in some cases, at least a portion of the enhancement of the luminescence is associated with the scale of the quantum structures in the porous semiconductor material. These quantum structures may allow a relaxation of the momentum selection rules by confining the charge carriers spatially, thus allowing direct band-gap transitions. Additionally, it has been demonstrated in porous silicon that the quantum confinement of charge carriers increases the effective band-gap, thereby pushing it into the visible region.

It is also generally agreed that the surface chemistry in porous semiconductor materials plays an important role in luminescence. This suggests that luminescence in passivated porous semiconductor materials may have similar mechanisms as in bulk semiconductor materials like Si, which exhibit band-gap widening into the visible region when hydride species are formed on the surface. A portion of the visible luminescence of porous Si, for example, may be associated with silicon hydride (SiH). It is not positively known whether the hydrogen termination serves only to passivate the surface or whether there is a contribution to the luminescence by amorphous SiH. Nevertheless, it is very clear that silicon microcrystals having dimensions of less than 5 nm, exhibit band-gap widening and the above-described band-gap luminescence.

Accordingly, there is a need for an improved LED structure and method for making which exhibits electroluminescent emission in the deep blue portion of the visible spectrum.

SUMMARY

The present invention is directed toward a light emitting diode device comprising a quarter-wavelength mirror structure formed within a substrate of silicon carbide of a first conductivity; a transparent layer of semiconducting material of a second conductivity (level) distinct from the first conductivity; and a light emitting layer of semiconducting material of the first conductivity located between the quarter-wavelength mirror structure and the transparent layer of semiconducting material.

A method of fabricating the above described light-emitting diode device is another aspect of the invention. The method comprises the steps of the formation of a light-emitting layer of semiconducting material in a substrate of silicon carbide of a first conductivity, followed by the formation of a quarter-wavelength dielectric mirror structure beneath this light emitting layer in the same substrate; and depositing a transparent layer of semiconducting material of a second conductivity on the light emitting layer.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Figure 1:
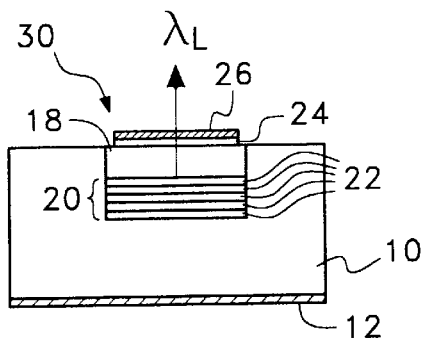
FIG. 1 is a cross-sectional side view depicting a LED made in accordance with the present invention.

Referring to FIG. 1, a multilayered light emitting diode (LED) formed in silicon carbide (SiC) according to the present invention is shown and depicted by numeral 30. The LED 30 comprises an n-type substrate 10 of alpha silicon carbide (α-SiC). Electrical contact to the substrate 10 is provided via an ohmic contact 12 composed of any suitable metal, such as nickel, in order to make electrical contact to n-type α-SiC substrates. A single "active" n-type light emitting layer or film 18 of passivated or unpassivated porous alpha silicon carbide (α-SiC) is formed within the substrate 10. An n-type layer 24 of a suitable transparent semiconducting material, such as indium tin oxide ($In_2O_3$) or zinc oxide (ZnO) is deposited on the active layer 18 to form a heterojunction, and also serves as a top-face mirror for a "porosity superlattice", also referred to as a Fabry-Perot optical cavity resonator 20. The deposited layer 24 should have thickness equal to an integer number of the peak emission wavelength divided by the optical index of refraction in that layer 24. The Fabry-Perot cavity 20 is formed within the substrate 10, underneath the active layer 18. The cavity 20 is comprised of greater than two distinct porous layers 22 of the substrate α-SiC 10, the porous layers 22 having sequentially alternating porosity with depth. The periodicity is not limited to two layers, buy may involve three or more different values of porosity in a periodic way. The thickness of each porous layer 22 is exactly $\lambda_c/4$, which enables the cavity 20 to serve as a quarter-wavelength mirror. Electrical contact to the deposited transparent layer 24 is provided by the deposition of a thin, transparent layer 26 of gold or other suitable contact. The contacts 12 and 26 operate to supply current to the LED 30.

When current is supplied via the contacts 12 and 26, the LED 30 provides an electroluminescent emission $\lambda_c$ of a spectrally narrow visible light having a spectral full width half maximum (FWHM) which is on the order of 50 meV in the deep blue to UV range, in a highly directed pattern via the porosity superlattice 20. The luminescence is peaked at a wavelength associated with the optical path length of each of the layers 22 as introduced by design. The deep, intense blue luminescence is accomplished via the appropriate preparation and passivation of a single active α-PSC layer 18 in conjunction with the transparent deposited semiconducting layer 24.

In other embodiments of the present invention, those skilled in the art will recognize that the substrate, the active porous layer 18 and the porous layers 22 of the superlattice 20 can be p-type. Those skilled in the art will further recognize that the α-SiC substrate 12, the α-SiC active porous layer 18 and the α-SiC porous layers 22 of the superlattice 20 can be of 6 H or like polytype. One of ordinary skill in the art will also recognize that the active layer 18 used in the present invention is not limited to porous silicon carbide, since epitaxial films (which are monocrystalline) can be grown directly on porous layers. For example, the quarter-wavelength multilayer porosity superlattice 20 is usable with gallium nitride (GaN), or any other epitaxially grown active layer film which is hexagonal and which, when used in an LED, could benefit from the spectral narrowing and enhanced directivity afforded by the quarter-wavelength multilayer porosity superlattice 20 of the present invention.

Still referring to FIG. 1, the LED 30 of the present invention further comprises a "porosity superlattice" 20 is formed within the substrate 10, underneath the active layer 18. The porosity superlattice 20 is comprised of greater than two porous layers 22 of n-type α-SiC, the porous layers 22 having alternating porosity. The thickness of each porous layer 22 is exactly $\lambda_c/4$, which enables the porosity superlattice 20 to serve as a quarter-wavelength mirror. When current is supplied via the contacts 12 and 28 the LED 30 provides an electroluminescent emission $\lambda_L$ of a spectrally narrow visible light having a spectral full width half maximum (FWHM) of less than 50 meV in the deep blue to UV range, in a highly directed pattern via the porosity superlattice 20. The luminescence is peaked at predetermined wavelength associated with specific design parameter values. The deep, intense blue luminescence is accomplished via the appropriate preparation and passivation of the single active α-PSC layer 18 in conjunction with the transparent epitaxial semiconducting layer 24.

In other embodiments of the present invention, those skilled in the art will recognize that the substrate, the active layer 18 and the porous layers 22 of the superlattice 20 can be p-type, with n-type epitaxial layers 24, 26. Those skilled in the art will further recognize that the α-SiC substrate 12, the α-SiC active layer 18, and the α-SiC porous layers 22 of the superlattice 20 can be a 6 H or like polytype. One of ordinary skill in the art will also recognize that the active layer 18 used in the present invention is not limited to porous silicon carbide, since epitaxial films (which are monocrystalline) can be grown directly on porous layers. For example, the quarter-wavelength multilayer porosity superlattice 20 is usable with Gallium Nitride (GaN), or any other epitaxially grown active layer film which could benefit from the spectra narrowing and directivity afforded by the quarter-wavelength multilayer porosity superlattice 20 of the present invention.

The fabrication of the multilayered LED 30 of FIG. 1 will now be described in further detail in conjunction with FIGS. 2A–2F. First, in FIG. 2A, metal layer or film 34 is deposited on a backside surface of a bulk, n-type α-SiC substrate wafer 32 from which a plurality of LEDs like the one shown in FIG. 1 will be fabricated. The metal film 34 can be optionally annealed if desired or necessary. The metal film provides an electrical contact for future electrochemical anodization processing of the wafer 32 and becomes the ohmic contact 12 for each LED 30 fabricated in the bulk substrate wafer 32 after dicing.

Figure 2A:
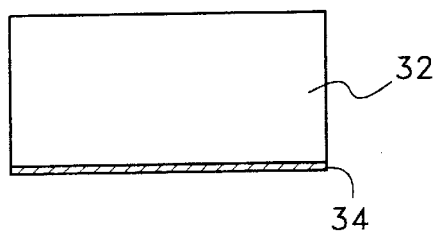
FIGS. 2A–2F are cross-sectional side views depicting a method for making the LED of FIG. 1, according to the present invention.
Figure 2B:
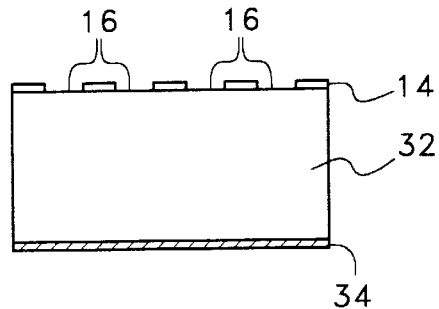
Figure 2C:
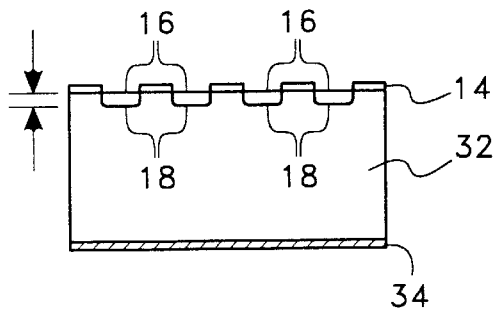

The FIGS. 2B and 2C depict the formation of the active layer 18 of each LED 30 in the bulk substrate wafer 32. In FIG. 2B, a photoresist layer 14 has been deposited and patterned on the front side of the bulk substrate wafer 32 using conventional techniques. The removed portions of the photoresist layer 14 exposes areas 16 of the bulk substrate wafer 32 which will be anodized in the next processing step. In FIG. 2C, the bulk substrate wafer 32 has been electrochemically anodized, thereby forming the thin porous film or active layer 18 of each LED in the bulk substrate wafer 32 at each of the exposed areas 16. This is accomplished in the present invention by using a galvanostatic (constant current) electrochemical anodization in aqueous HF or other appropriate electrolytic acid solution, with ethanol or other suitable surfactant. The anodization can be either dark or photo-assisted. Methods for dark-current and photo-assisted electrochemical anodization can be found in U.S. Pat. Nos. 5,298,767 and 5,454,915, both issued to Shor et al. The disclosures of these patents are incorporated herein by reference.

Referring still to FIG. 2C, the thickness L of each active layer 18 is chosen to correspond precisely to the desired peak emission wavelength $\lambda_c$ by the relation $m\lambda_c=nL$, where n is the index of refraction of the active layer 18 and m is an integer. It has been shown in Jonathan E. Spanier, et al., "Effects of Nanocrystalline Structure and Passivation on the Photoluminescent Properties of Porous Silicon Carbide", Mat. Res. Soc. Symp. Proc. Vol 452, pp 491–496, (1997), that the intensity of the luminescence is dependent upon the nanostructure and porosity, which, in turn, depend upon the preparation conditions, particularly the formation density of the active layer. Higher porosity active layers, however, also suffer from higher series resistances. The selected duration of the anodization of the active layer 18 at a particular current density, is based on previously acquired anodization rate data of the identical material and conditions, including the substrate doping level, crystallographic face, electrolyte concentration, etc . . . for the particular current density.

After anodizing, the active PSC layers 18 are passivated with a passivation agent such as oxygen or hydrogen, using conventional techniques before the bulk substrate wafer 32 is processed further. Passivating the active PSC layer 18 enhances the luminescence in the blue range of the spectrum. Passivation enables the microcrystalline structures to satisfy the conditions for quantum confinement by preventing surface recombination at the dangling bond. A passivating agent such as atomic hydrogen is preferably deposited by a plasma or by an HF dip. If oxygen is used as the passivating agent, passivation can be accomplished by thermal oxidation, anodic or PECVD (plasma enhanced chemical vapor deposition) of oxygen. It should be understood that any other passivating agent which will pin the dangling bond sites can also be employed for passivating the PSC active layer 18.

Figure 2D:
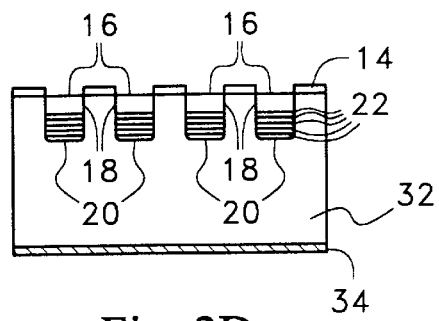

After the active layers 18 are formed and passivated, the porous superlattice 20 is fabricated as depicted in FIG. 2D. The porous layers 22 of the porous superlattice 20 are formed in the bulk substrate wafer 32, each layer having a thickness corresponding to one-quarter of the peak emission wavelength. This is achieved by dark-current or photo-assisted electrochemical anodization using the methods described in U.S. Pat. Nos. 5,298,767 and 5,454,915. More specifically, the porous layers 22 of each superlattice 20 alternate in porosity. This is made possible by periodically changing the current density and/or illumination intensity and/or wavelength characteristics at appropriate time intervals. The thickness of each of the porous layers 22 of the superlattice 20 is exactly $\lambda_c/4$, thus, the superlattice 20 operates as a quarter-wavelength multilayer mirror.

Figure 2E:
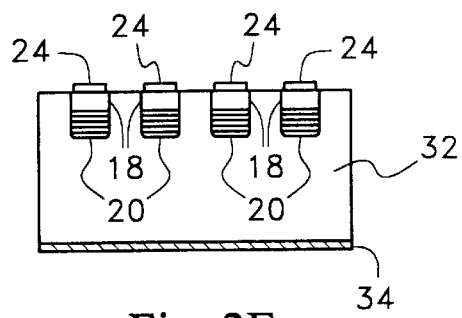
Figure 2F:
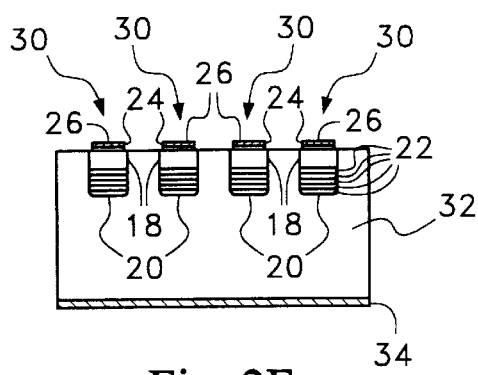

Once the superlattice 20 is completed, the n-type epitaxial layer 24 of transparent semiconducting material is deposited directly onto each of the active layers 18 as shown in FIG. 2E to form a heterojunction diode thereat. Thin, transparent ohmic contacts are deposited and patterned on the layer 24, and after which the bulk substrate wafer 32 is diced to separate the plurality of LEDs 30.

In other embodiments of the LED of present invention, where the active layer is having an active layer 18 other than PSC are fabricated in a similar manner. However, in these embodiments, instead of forming active layer in the bulk substrate wafer prior to forming the porosity superlattice 20, the porosity superlattice is formed first. The active layer 18 is then formed after the porosity superlattice 20 is fabricated in the bulk substrate wafer 32. This is accomplished by epitaxially growing a film, of for instance GaN, on the porosity superlattice 20. The LEDs are then completed as described above.

It will be understood that the embodiments described herein are merely exemplary and that a person skilled in the art may make many variations and modifications to the described embodiments utilizing functionally equivalent elements to those described. Any variations or modifications to the invention described hereinabove are intended to be included within the scope of the invention as defined by the appended claims.

What is claimed is:

1. A method of fabricating a light emitting diode device, comprising the steps of:

forming a quarter-wavelength mirror structure in a substrate of silicon carbide of a first conductivity;

placing a light emitting layer of semiconducting material of said first conductivity in front of said quarter-wavelength mirror structure; and depositing a transparent layer of semiconducting material of a second conductivity distinct from said first conductivity on said light emitting layer.

2. The method according to claim 1, wherein the step of placing a light emitting layer of semiconducting material in front of said quarter-wavelength mirror structures includes the step of forming a porous layer of silicon carbide in said substrate, said porous layer operating as said light emitting layer.

3. The method according to claim 2, wherein said step of forming said porous layer includes the step of electrochemically anodizing a selected region of said substrate to form said porous layer of silicon carbide.

4. The method according to claim 3, further comprising the step of passivating said porous light emitting layer.

5. The method according to claim 3, wherein said step of forming a quarter-wavelength mirror structure includes the step of forming a sequence of porous silicon carbide layers of alternating porosities under said porous layer.

6. The method according to claim 5, wherein said sequence of porous layers comprises a multilayer porosity superlattice.

7. The method according to claim 6, wherein said multilayer porosity superlattice comprises greater than two layers of said porous silicon carbide.

8. The method according to claim 5, wherein said step of forming said sequence of porous silicon carbide layers includes the step of electrochemically anodizing selected regions of said substrate underneath said porous light emitting layer.

9. The method according to claim 1, wherein said light emitting layer of semiconducting material comprises gallium nitride.

10. The method according to claim 1, wherein said transparent layer of semiconducting material comprises indium tin oxide.

11. The method according to claim 1, wherein said transparent layer of semiconducting material comprises zinc oxide.

12. A method of fabricating a light emitting diode device, comprising the steps of:

forming a quarter-wavelength mirror structure in a substrate of silicon carbide of a first conductivity, said quarter-wavelength mirror structure comprising a multilayer porosity superlattice;

placing a light emitting layer of semiconducting material of said first conductivity in front of said quarter-wavelength mirror structure; and depositing a transparent layer of semiconducting material of a second conductivity distinct from said first conductivity on said light emitting layer.

* * * * *